United States Patent [19]

Kushida

[11] Patent Number: 5,559,346

[45] Date of Patent: Sep. 24, 1996

[54] FIELD-EFFECT SEMICONDUCTOR DEVICE WITH INCREASED BREAKDOWN VOLTAGE

[75] Inventor: Tomoyoshi Kushida, Seto, Japan

[73] Assignee: Toyota Jidosha Kabushiki Kaisha, Toyota, Japan

[21] Appl. No.: 324,662

[22] Filed: Oct. 18, 1994

[30] Foreign Application Priority Data

Mar. 2, 1994 [JP] Japan ................................. 6-032525
Jun. 23, 1994 [JP] Japan ................................. 6-141806

[51] Int. Cl.$^6$ .......................... H01L 29/74; H01L 31/111
[52] U.S. Cl. .......................... 257/138; 257/136; 257/140; 257/145; 257/148; 257/153
[58] Field of Search ............................. 257/136, 138, 257/122, 140, 141, 142, 145, 146, 148, 153, 126, 127

[56] References Cited

U.S. PATENT DOCUMENTS

| Re. 29,971 | 4/1979 | Nishizawa et al. | 257/136 |
| 3,828,230 | 8/1974 | Nishizawa et al. | 257/136 |
| 4,132,996 | 1/1979 | Baliga | 257/136 |
| 4,337,473 | 6/1982 | Nishizawa | 257/138 |
| 4,779,125 | 10/1988 | Remmerie et al. | 257/138 |
| 4,811,075 | 3/1989 | Eklund | 257/136 |
| 5,124,773 | 6/1992 | Nakagawa et al. | 257/138 |

FOREIGN PATENT DOCUMENTS

| 0272753 | 6/1988 | European Pat. Off. | 257/141 |
| 52-6076 | 2/1977 | Japan . | |
| 57-211777 | 12/1982 | Japan | 257/122 |
| 62-24953 | 5/1987 | Japan . | |
| 62-174977 | 7/1987 | Japan . | |
| 64-51668 | 2/1989 | Japan . | |

Primary Examiner—Mahshid Saadat
Attorney, Agent, or Firm—Cushman, Darby & Cushman

[57] ABSTRACT

A field-effect semiconductor device for reducing on-state source-drain voltage and increasing breakdown voltage, has a one conductivity type semiconductor region, a source region of one conductivity type, a drain region, and gate regions of other conductivity type. The source region, the drain region and the gate regions are formed in the semiconductor region and contiguous to a surface of the semiconductor region. The gate regions are located so as to sandwich a portion of the semiconductor region coupling the source region and the drain region.

25 Claims, 13 Drawing Sheets

FIELD-EFFECT SEMICONDUCTOR DEVICE WITH INCREASED BREAKDOWN VOLTAGE

BACKGROUND OF THE INVENTION

1. Field of the Invention

This invention relates to field-effect semiconductor devices and, more particularly, to field-effect semiconductor devices which can reduce the on-state source-drain saturation voltage.

2. Description of the Prior Art

As one type of the field-effect transistors that have heretofore been used, there is known a static induction transistor (hereinafter referred to as SIT). The SIT realizes the same characteristics as those of the triode in the form of a transistor. Japanese Laid-Open Patent Publication No. 64-51668 shows examples of the SIT structure.

FIG. 31 is a sectional view showing the structure of a prior art example. Illustrated in FIG. 31 is an SIT 200 which comprises a semiconductor substrate 201 having a recess with an n-type island semiconductor region 203 provided wherein via an insulation layer 202. In the following description, an n-type semiconductor region is referred to as n-type region, and a p-type semiconductor region is referred to as p-type region.

In the n-type region 203, an $n^+$-type source region 204 and an $n^+$-type drain region 205 are formed, and also a ring-like p-type gate region 206 is formed such as to surround the $n^+$-type source region 204. In the following description, an $n^+$-type region and a $p^+$-type region are referred to as a region where impurity concentration is high.

A source electrode 208, a drain electrode 209 and a gate electrode 211 are provided in ohmic connection to the $n^+$-type source region 204, the $n^+$-type drain region 205 and the p-type gate region 206 via contact holes 207a, 207b and 207c formed in an oxide insulation layer 207, respectively. Thus, as shown by dashed line 212, a drain-source current path is provided which extends through the n-type semiconductor region 203 from the $n^+$-type drain region 205 to the $n^+$-type source region 204. In this case, the drain-source current flows by bypassing the gate region 206, that is, it flows for a long distance through the high resistivity n-type region 203. Therefore, on-state source-drain saturation voltage is rather high.

It has been thought to reduce the on-state source-drain saturation voltage by forming an $n^+$-type buried region in the entire bottom of the n-type region 203 such that the source-drain current flows through this $n^+$-type buried region. However, where the $n^+$-type buried region is formed, it is required to form the n-type region 203 over the $n^+$-type buried region by using epitaxial techniques, thus leading to high cost of manufacture.

FIG. 32 shows a different prior art example which is shown in Japanese Laid-Open Patent Publication No. 62-174977. As shown in FIG. 32, a drain electrode 245C is formed on an insulating support substrate 240. An $n^+$-type drain region 245 of a high impurity concentration is formed on the drain electrode 245C. An n-type channel region 246 of a low impurity concentration is formed on the drain region 245. The top of the n-type channel region 246 has raised and recessed portions. Atop the raised portion, an $n^+$-type source region 243 of a high impurity concentration is formed. A source electrode 243C is formed on the $n^+$-type source region 243. On the side walls and bottom of the recessed portion, an undoped gate region 244 is formed. A gate electrode 244C is formed on the outer side of the gate region 244. With the semiconductor device having this structure, switching of the resistance between the source and drain regions 243 and 245 is obtainable by switching the potential applied to the gate electrode 244C.

While the above device is operable satisfactorily as a static induction transistor, its breakdown voltage basically greatly depends on the film thickness L of the channel region 246. Therefore, it is impossible to obtain sufficient breakdown voltage when the thickness L of the channel region 246 is thin. When the channel region 246 is formed by a method of forming a semiconductor layer, such as a SIMOX process, in which an Si layer is formed on an $SiO_2$ insulation layer by oxygen ion implantation into an Si substrate and a subsequent high temperature annealing treatment, the thickness of the Si layer is thin. On the other hand, increasing the film thickness L to increase the breakdown voltage leads to an increase of the on-state source-drain saturation voltage.

SUMMARY OF THE INVENTION

An object of the invention is to provide a field-effect semiconductor device which can reduce the on-state source-drain saturation voltage at low cost by forming a main source-drain current path along the substrate surface.

Another object of the invention is to increase the breakdown voltage of an SIT in the depth direction thereof.

A further object of the invention is to realize a complementary circuit configuration in the field-effect semiconductor device.

A still further object of the invention is to prevent element surface leak of channel current in the field-effect semiconductor device.

A yet further object of the invention is to extremely improve the breakdown voltage of a MOS field-effect transistor.

A yet another object of the invention is to reduce the size of the MOS field-effect transistor.

According to one aspect of the invention, there is provided a field-effect semiconductor device, which comprises a source region of one conductivity type and a drain region both formed in a semiconductor region of a first conductivity type and contiguous to a surface of the semiconductor region, and gate regions of a second conductivity type formed in the semiconductor region and contiguous to the same surface as of the source region and the drain region such as to sandwich at least a portion of the semiconductor region coupling the source region and the drain region to each other.

With this field-effect semiconductor device, the portion of the semiconductor region of the first conductivity type does not bypass the gate regions, so that it is possible to reduce the dimension of the portion coupling the source region and the drain region to each other. Thus, it is possible to reduce the on-state source-drain saturation voltage.

Where the drain region is of the first conductivity type, it is of the same conductivity type as the source region, and thus the semiconductor device constitutes a transistor. Where the drain region is of a conductivity type that is opposite the conductivity type of the source region, the semiconductor device constitutes a thyristor.

In this type of field-effect semiconductor device, preferably, another conductivity type semiconductor region is provided such that it is contiguous to an end surface of the source region in the depth direction thereof. If this conductivity type semiconductor region is provided such that it is contiguous to the end surface of the source region in the depth direction thereof, it is possible to increase the breakdown voltage of the field-effect semiconductor device even if the gate region is comparatively shallow.

According to another aspect of the invention, there is provided a field-effect semiconductor device, which comprises a first conductivity type semiconductor region, an a second conductivity type island semiconductor region surrounded by the first conductivity type semiconductor region and formed in and contiguous to the surface of the first conductivity type semiconductor region, a source region of the second conductivity type and a drain region both formed in and contiguous to the surface of the second conductivity type island semiconductor region, and gate regions of one conductivity type formed in the other conductivity type island semiconductor region and contiguous to the same surface as of the source region and the drain region such as to sandwich a portion of the other conductivity type island semiconductor region coupling the source region and the drain region to each other.

In this case, the other conductivity type island semiconductor region provided in and contiguous to the surface of the one conductivity type semiconductor constitutes a channel, and thus the source-drain current flows substantially only in the lateral direction. It is thus possible to provide a high breakdown voltage of the field-effect semiconductor device even by using a shallower gate region. Further, by using this device structure in combination with the field-effect semiconductor device noted before, it is possible to realize complementary circuit structures and increase the circuit design freedom.

In this case, because the source region is of one conductivity type, with the drain region also of this conductivity type, i.e., of the same conductivity type as that of the source region, the semiconductor device constitutes a transistor. On the other hand, with the drain region of one conductivity type, i.e., of the opposite conductivity type to that of the source region, the device constitutes a thyristor.

According to a further aspect of the invention, there is provided a field-effect semiconductor device, which comprises a first one conductivity type semiconductor region, a first other conductivity type semiconductor region formed in the first one conductivity type semiconductor region and contiguous to a surface of the first one conductivity type semiconductor region, a drain region formed in the first one conductivity type semiconductor region and contiguous to the first other conductivity type semiconductor region and to the surface of the first one conductivity type semiconductor region, second one conductivity type semiconductor regions sandwiching the first other conductivity type semiconductor region, a second other conductivity type semiconductor region formed in the first one conductivity type semiconductor region and contiguous to the surface of the first one conductivity type semiconductor region on the opposite side of the drain region such as to be spaced apart a predetermined distance from the first other conductivity type semiconductor region, a gate electrode covering a portion of the first one conductivity type semiconductor region between the first other conductivity type semiconductor region and the second other conductivity type semiconductor region via an insulation layer, and a conductive material electrically connecting the second one conductivity type semiconductor regions and the second other conductivity type semiconductor region to each other.

This field-effect semiconductor device has a structure such that the drain of a MOS field-effect transistor and the source of a junction field-effect semiconductor device (which may be an SIT) are in series and such that the source of the former and the gate of the latter are connected to each other.

Thus, when the MOS field-effect transistor is turned on, the junction field-effect semiconductor device is also turned on. When the MOS field-effect transistor is turned off, the reverse bias between the gate and the source of the junction field-effect semiconductor device is increased, and thus the junction field-effect transistor is simultaneously turned off. It is thus possible to provide an extremely increased breakdown voltage of the MOS field-effect semiconductor device.

In this case, the first other conductivity type semiconductor region constitutes the source region. Thus, where the drain region is of other conductivity type, the semiconductor device constitutes a transistor. Where the drain region is of one conductivity type, on the other hand, the device constitutes an insulated gate bipolar transistor (IGBT).

According to a still further aspect of the invention, there is provided a field-effect semiconductor device, which comprises a first one conductivity type semiconductor region, a first other conductivity type semiconductor region formed in the first one conductivity type semiconductor region and contiguous to a surface of the first one conductivity type semiconductor region, a drain region formed in the first one conductivity type semiconductor region and contiguous to the first other conductivity type semiconductor region and to the surface of the first one conductivity type semiconductor region, second one conductivity type semiconductor regions sandwiching the first other conductivity type semiconductor region, a third one conductivity type semiconductor region formed on the opposite side of the drain region and contiguous to the first other conductivity type semiconductor region, a second other conductivity type semiconductor region formed in the first one conductivity type semiconductor region and contiguous to the surface of the first one conductivity type semiconductor region such as to sandwich the third one conductivity type semiconductor region between the first and the second other conductivity type semiconductor regions, a gate electrode covering a portion of the third one conductivity type semiconductor region between the first other conductivity type semiconductor region and the second other conductivity type semiconductor region via an insulation layer, and a conductive material electrically connecting the second one conductivity type semiconductor regions and the second other conductivity type semiconductor region to each other.

With this construction, the second other conductivity type semiconductor region is formed to sandwich the third one conductivity type semiconductor region between the first and the second other conductivity type semiconductor regions so as to constitute a MOS structure. With this MOS structure, it is possible to reduce the thickness of the channel-forming third one conductivity type semiconductor region. It is thus possible to reduce the gate length (i.e., gate electrode length) of the MOS field-effect transistor.

In this case, the gate electrode covers a portion of the third one conductivity type semiconductor region between the first other conductivity type semiconductor region and the second other conductivity type semiconductor region via an insulation layer. Further, the conductive material is electrically connecting the second one conductivity type semiconductor regions and the second other conductivity type semiconductor region.

Thus, the second other conductivity type semiconductor region which constitutes the source of the MOS transistor and the second one conductivity type semiconductor regions which constitute the gate of the junction field-effect semiconductor device can be held at the same potential.

In this case, the first other conductivity type semiconductor region constitutes the source region of the junction field-effect semiconductor device. Thus, when the drain region is of other conductivity type, the semiconductor device constitutes a transistor. When the drain region is of one conductivity type, the device constitutes a thyristor.

The present invention will be more fully understood from the following detailed description and appended claims when taken with the accompanying drawings.

DETAILED DESCRIPTION OF THE PREFERRED EMBODIMENTS

Preferred embodiments of the invention will now be described with reference to the drawings.

Figure 1:
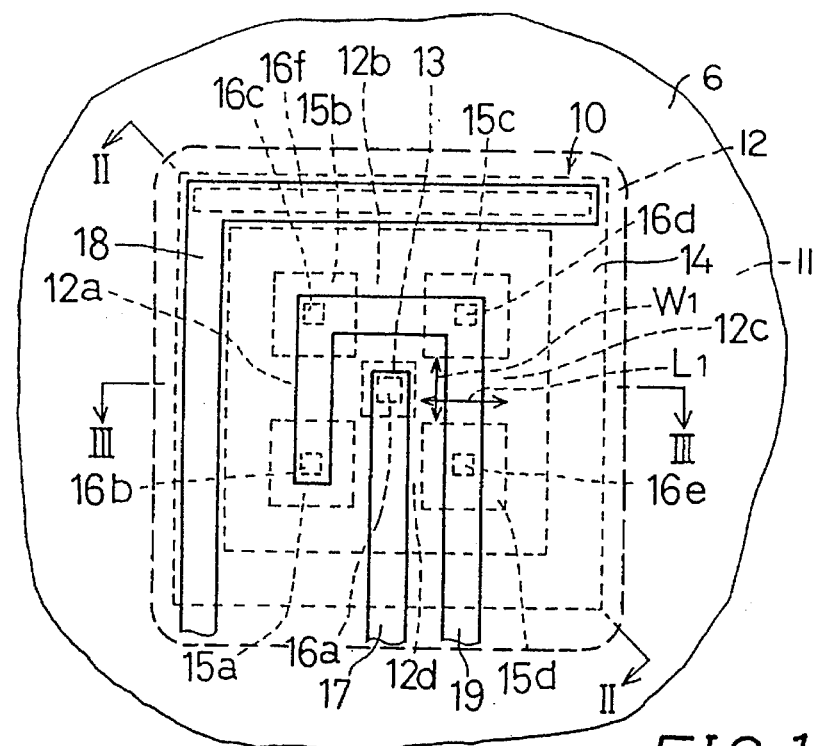
FIG. 1 plan view showing a field-effect semiconductor device according to a first embodiment of the invention.
Figure 2:
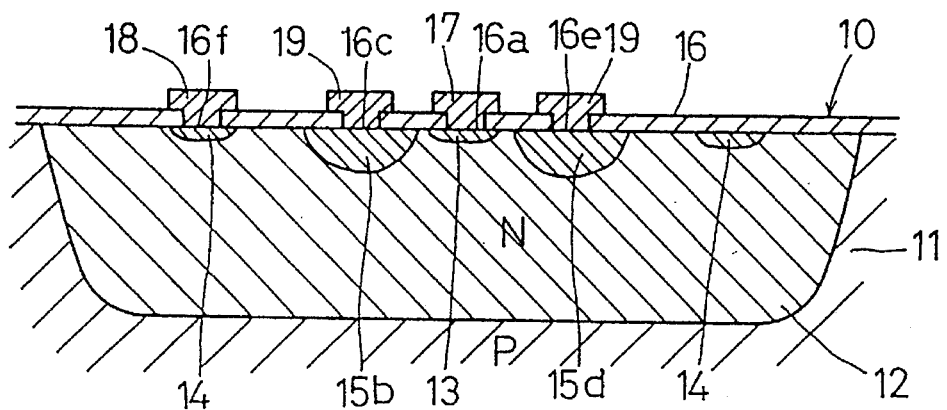
FIG. 2 is a cross-sectional view taken along line II—II in FIG. 1.
Figure 3:
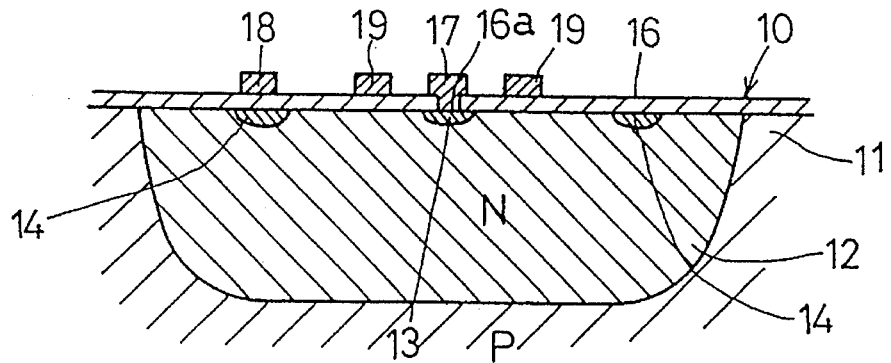
FIG. 3 is a cross-sectional view taken along line III—III in FIG. 1.

FIGS. 1 to 3 illustrate a field-effect semiconductor device according to a first embodiment of the invention. As shown therein, an SIT 10 comprises a p-type substrate 11 and an n-type island region 12 formed therein as a one conductivity type semiconductor region. In the n-type island region 12, an $n^+$-type source region 13 and an $n^+$-type drain region 14, which have higher n-type impurity concentration than the n-type region 12, are formed such that they are contiguous to the surface of the n-type region 12.

Further, $p^+$-type gate regions 15a to 15d are formed as other conductivity type gate regions in the n-type region 12 such that they sandwich portions of the n-type region 12 coupling the $n^+$-type source region 13 and the $n^+$-type drain region 14 to each other (i.e., in this case four coupling portions constituting respective channels 12a to 12d).

If a p-type layer is provided between the surface of the coupling portions coupling the $n^+$-type source region 13 and the $n^+$-type drain region 14 to each other and an oxide insulation layer 16, as in a case of FIGS. 13 to 15 to be described later, it is possible to reduce leaks between the oxide insulation layer 16 and the channels 12a to 12d and also reduce recombination current across the interface between the semiconductor and the oxide insulation layer 16.

By appropriately selecting width $W_1$, length $L_1$ and impurity concentration of the channels 12a to 12d such as to make the product $G_m^* r_s$ of transconductance $G_m$ and source resistance $r_s$ to be less than unity, a normally-on SIT is obtained, which has an unsaturated current-voltage characteristic. By increasing $G_m^* r_s$, a junction field-effect transistor (hereinafter referred to as JFET) can be obtained which has a saturated current-voltage characteristic. (see Japanese Patent Publication No. 52-6076).

Meanwhile, by reducing the channel width W1 to be smaller than double the spread area of the depletion region in the neighborhood of the gate at zero bias, the channels 12a to 12d are pinched off at zero bias. Thus, a normally-off SIT is obtained (see Japanese Patent Publication No. 62-24953).

The distinction of the normally-on SIT, normally-off SIT and JFET from one another is applicable as well to the embodiments that will be described hereinafter.

Further, a source electrode 17, a drain electrode 18 and a gate electrode 19 are provided in ohmic connection to the $n^+$-type source region 13, the $n^+$-type drain region and the $p^+$-type gate regions 15a to 15d via contact holes 16a, 16f and 16b to 16e formed in the oxide insulation layer 16, respectively.

In this case, the $n^+$-type source region 13 and the $n^+$-type drain region 14 are of high impurity concentration in order that they are in ohmic connection to electrodes 17 and 18. However, they may not be of high impurity concentration if they are not to be ohmic connection to the electrodes 17 and 18. This is applicable as well to the embodiments to be described hereinunder.

With the above construction, the four portions of the n-type region 12 that couple the $n^+$-type source region 13 and the $n^+$-type drain region 14 to each other, i.e., the channels 12a to 12d, do not bypass the $p^+$-type gate regions 15a to 15d. It is thus possible to reduce the dimension of the channels 12a and 12d, that is, it is possible to reduce the on-state source-drain saturation voltage of the SIT 10.

Figure 4:
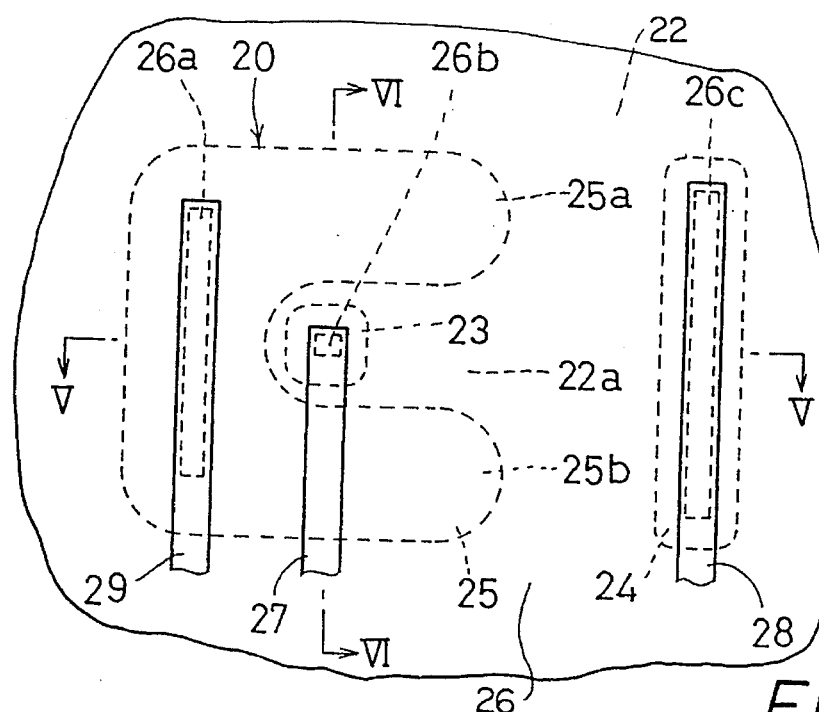
FIG. 4 is a plan view showing a field-effect semiconductor device according to a second embodiment of the invention.
Figure 5:
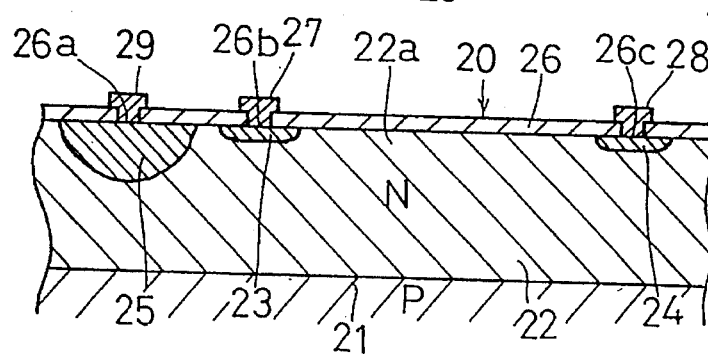
FIG. 5 is a cross-sectional view taken along line V—V in FIG. 4.
Figure 6:
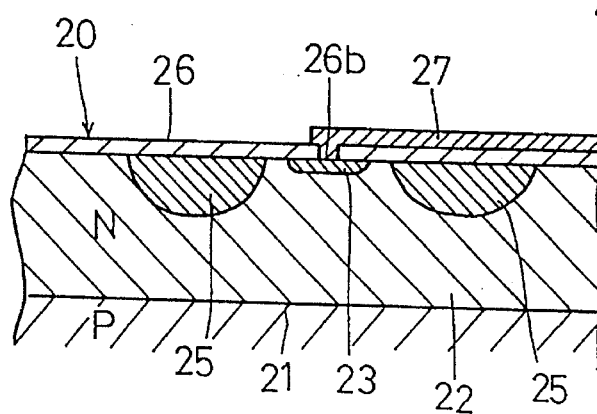
FIG. 6 is a cross-sectional view taken along line VI—VI in FIG. 4.

Referring to FIGS. 4 to 6, shown therein is a field-effect semiconductor device according to a second embodiment of the invention. As shown therein, and like the preceding first embodiment, an SIT 20 comprises a p-type substrate 21 and an n-type island region 22 formed therein as a one conductivity type semiconductor region. Further, in the n-type region 22, an $n^+$-type source region 23 and an $n^+$-type drain region 24, which have higher n-type impurity concentration than the n-type region 22, are formed such that they are contiguous to the surface of the n-type region 22.

As an other conductivity type gate region, a channel-shaped $p^+$-type gate region 25 is provided such that its end or arm portions 25a and 25b sandwich a portion of the n-type region 22 that couples together the $n^+$-type source region 23 and the $n^+$-type drain region 24, i.e., a channel 22a.

A source electrode 27, a drain electrode 28 and a gate electrode 29 are provided in ohmic connection to the $n^+$-type source region 23, the $n^+$-type drain region 24 and the $p^+$type gate region 25 via contact holes 26b, 26c and 26a formed in an oxide insulation layer 26, respectively.

With this construction, the portion of the n-type region 22 that couples together the $n^+$-type source region 23 and the $n^+$-type drain region 24, i.e., the channel 22a, does not bypass the $p^+$-type gate region 25. Thus, it is possible to reduce the dimension of the channel 22a and hence reduce the on-state source-drain saturation voltage of the SIT 20.

Figure 7:
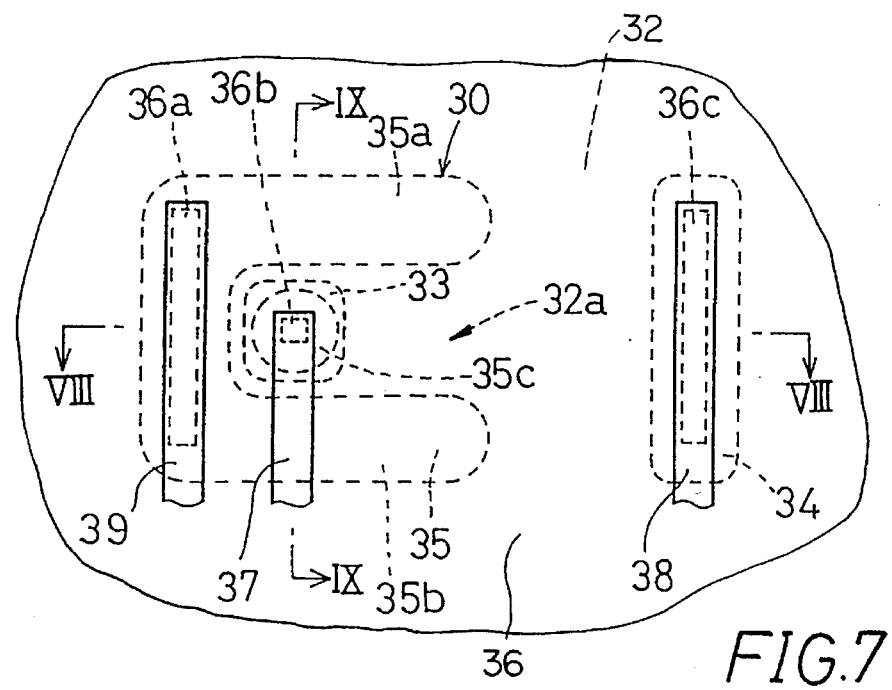
FIG. 7 is a plan view showing a field-effect semiconductor device according to a third embodiment of the invention.
Figure 8:
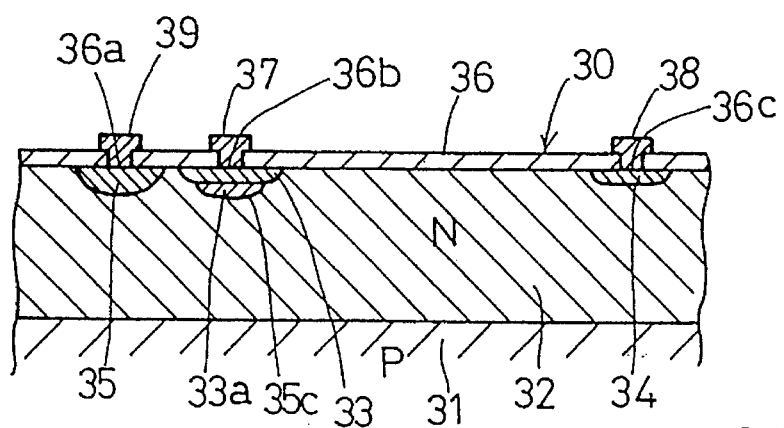
FIG. 8 is a cross-sectional view taken along line VIII—VIII in FIG. 7.
Figure 9:
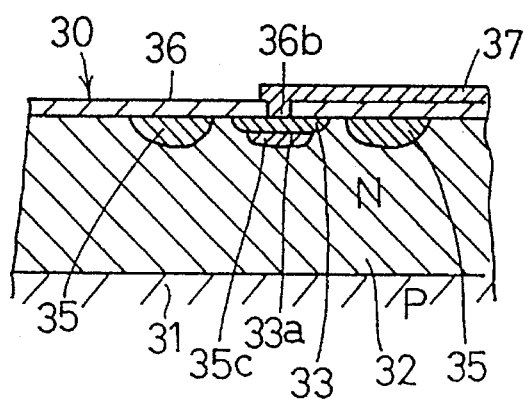
FIG. 9 is a cross-sectional view taken along line IX—IX in FIG. 7.

Referring to FIGS. 7 to 9, shown therein is a field-effect semiconductor device according to a third embodiment of the invention. As shown therein, and like the second embodiment, an SIT 30 comprises a p-type substrate 31 and an n-type island region 32 formed therein as a one conductivity type semiconductor region. Further, in the n-type region 32 an $n^+$-type source region 33 and an $n^+$-type drain region 34, which have higher n-type impurity concentration than the n-type region 32, are formed such that they are contiguous to the surface of the n-type region 32.

As an other conductivity type gate region, a channel-shaped $p^+$-type gate region 35 is provided such that its end or arm portions 35a and 35b sandwich a portion of the n-type region 32 coupling together the $n^+$-type source region 33 and the $n^+$-type drain region 34, i.e., a channel 32a. Further, a $p^+$-type floating gate region 35C is provided such that it is contiguous to an end surface 33a of the $n^+$-type source region 33 in the depth direction thereof.

A source electrode 37, a drain electrode 38 and a gate electrode 39 are provided in ohmic connection to the $n^+$-type source region 33, the $n^+$-type drain region 34 and the $p^+$-type gate region 35 via contact holes 36b, 36c and 36a formed in an oxide insulation layer 36, respectively.

With this construction, the portion of the n-type region 32 that couples together the $n^+$-type source region 33 and the $n^+$-type drain region 34, i.e., the channel 32a, does not bypass the $p^+$-type gate region 35. Thus, it is possible to reduce the dimension of the channel 32a and hence reduce the on-state source-drain saturation voltage of the SIT 30.

Further with the $p^+$-type floating gate region 35c provided such that it is contiguous to the end surface 33a of the $n^+$-type source region 33, the SIT 30 has a high breakdown voltage even if the $p^+$-type gate region 35 is comparatively shallow.

The $p^+$-type floating gate region 35c may, instead of being as such, be connected to the $p^+$-type gate region 35 by using a diffusion layer or the like. In this case, since the $p^+$-type floating gate 35c and the $n^+$-type source region 33 have high impurity concentration, the breakdown voltage of the junction between the two regions is low. Accordingly, the source-drain breakdown voltage of the SIT 30 may be reduced.

Figure 10:
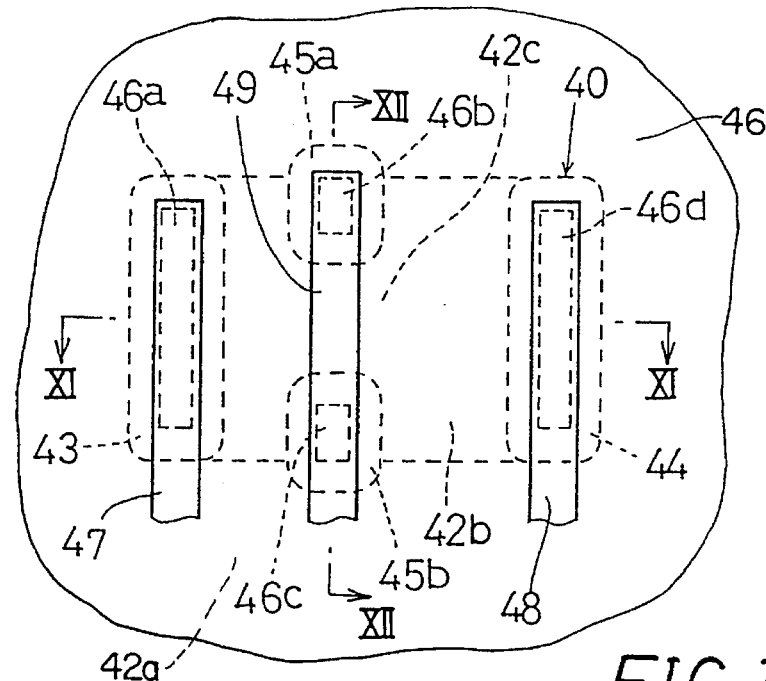
FIG. 10 is a plan view showing a field-effect semiconductor device according to a fourth embodiment of the invention.
Figure 11:
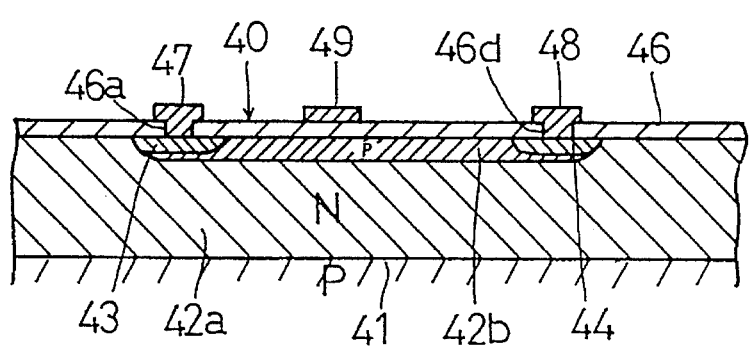
FIG. 11 is a cross-sectional view taken along line XI—XI in FIG. 10.
Figure 12:
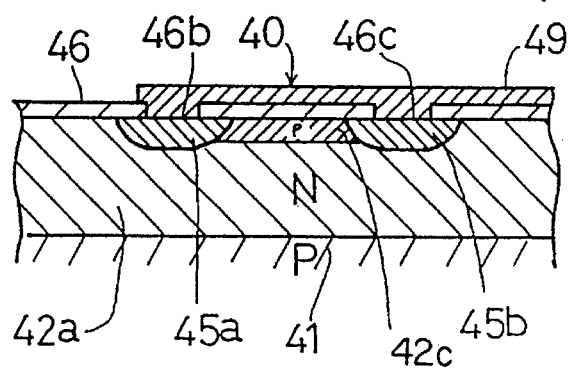
FIG. 12 is a sectional view taken along line XII—XII in FIG. 10.

Referring to FIGS. 10 to 12, shown therein is a field-effect semiconductor device according to a fourth embodiment of the invention. As shown therein, an SIT 40 comprises a p-type substrate 41 and an n-type island region (or well layer) 42a provided therein as a one conductivity type semiconductor region. Further, in the n-type region 42a, an p-type island region 42b is formed as an other conductivity type semiconductor region contiguous to the surface of the n-type region 42a. In the p-type region 42b surrounded by the n-type region 42a, a $p^+$-type source region 43 and a $p^+$-type drain region 44, both having higher p-type impurity concentration than the p-type region 42b, are formed such that they are contiguous to the surface of the p-type region 42b.

$N^+$-type gate regions 45a and 45b are formed as one conductivity type gate regions such as to sandwich a portion of the p-type region 42b that couples together the $p^+$-type source region 43 and the $p^+$-type drain region 44, i.e., a channel 42c.

A source electrode 47, a drain electrode 48 and a gate electrode 49 are provided in ohmic connection to the $p^+$-type source region 43, the $p^+$-type drain region 44 and the $n^+$-type gate regions 45a and 45b via contact holes 46a, 46d and 46b and 46c formed in an oxide insulation layer 46, respectively.

With the above construction, the portion of the p-type region 42b that couples together the $p^+$-type source region 43 and the $p^+$-type drain region 44, i.e., the channel 42c, does not bypass the $n^+$-type gate regions 45a and 45b. Thus, it is possible to reduce the dimension of the channel 42c and hence the on-state source-drain saturation voltage of the SIT 40.

In this case, the n-type island region 42a and the n⁺-type gate regions 45a and 45b are in contact with one another and held at the same potential. In addition, since the channel 42c is formed in the p-type region 42b, a purely lateral (i.e., lateral in the illustrated direction, hereinafter being the same) SIT structure can be obtained. That is, no vertical SIT structure is formed, and no current flows from the p-type region 42b to the n-type region 42a. It is thus possible to provide a high breakdown voltage of the SIT 40 with a shallower diffusion layer.

By combining the second and fourth embodiments, an n-channel SIT and a p-channel SIT may be readily formed on the same substrate, and thus an SIT complementary circuit may be readily formed.

Figure 13:
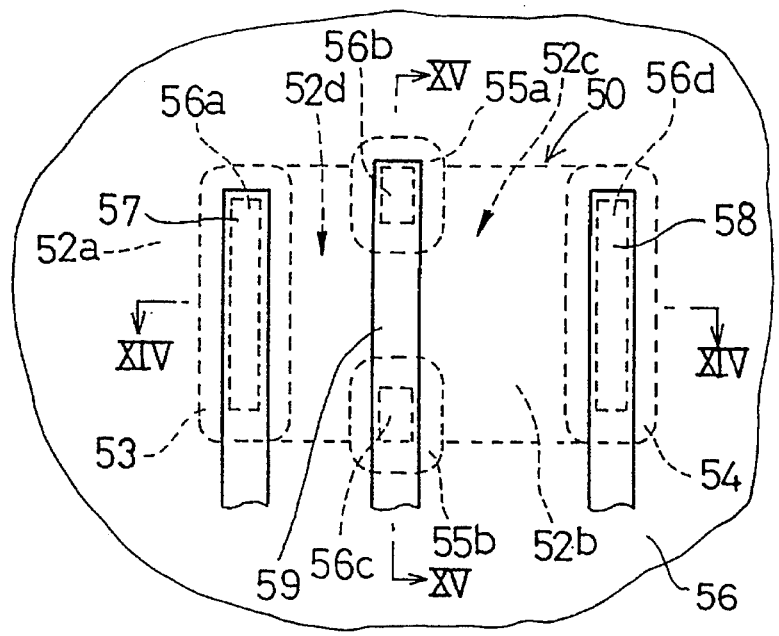
FIG. 13 is a plan view showing a field-effect semiconductor device according to a fifth embodiment of the invention.
Figure 14:
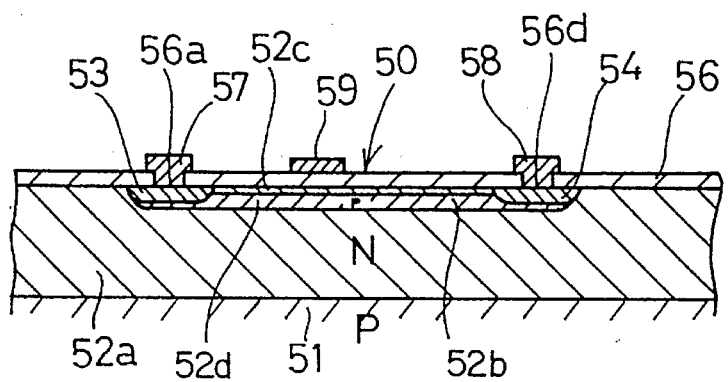
FIG. 14 is a cross-sectional view taken along line XIV—XIV in FIG. 13.
Figure 15:
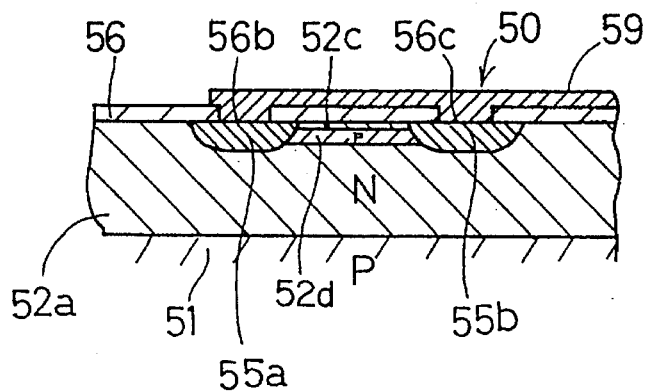
FIG. 15 is a cross-sectional view taken along line XV—XV in FIG. 13.

Referring to FIGS. 13 to 15, shown therein is a field-effect semiconductor device according to a fifth embodiment of the invention. As shown therein, an SIT 50 comprises a p-type substrate 51 and an n-type island region (or well layer) 52a formed therein as a one conductivity type semiconductor region. A p-type island region 52b is formed in the n-type island region 52a. In the p-type region 52b, a p⁺-type source region 53 and a p⁺-type drain region 54, both having higher p-type impurity concentration than the p-type region 52b, are formed such that they are contiguous to the surface of the p-type region 52b.

N⁺-type gate regions 55a and 55b are formed as one conductivity type gate regions such that they sandwich a portion of the p-type region 52b coupling together the p⁺-type source region 53 and the p⁺-type drain region 54, i.e., a channel 52d. Further, an n-type diffusion layer 52c is formed on the upper side of the channel 52d for covering the channel 52d.

A source electrode 57, a drain electrode 58 and a gate electrode 59 are provided an ohmic connection to the p⁺-type source region 53, the p⁺-type drain region 54 and the type gate regions 55a and 55b via contact hole 56a, 56d and 56b and 56c formed in an oxide insulation layer 56, respectively.

With the above construction, the portion of the p-type region 52b that couples together the p⁺-type source region 53 and the p⁺-type drain region 54, i.e., the channel 52d, does not bypass the n⁺-type gate regions 55a and 55b. Thus, it is possible to reduce the dimension of the channel 52d and hence the on-state source-drain saturation voltage of the SIT 50.

Further, with the provision of the diffusion layer 52c of the same conductivity type as the n⁺-type gate regions 55a and 55b between the channel 52d and the oxide insulation layer 56 of the lateral SIT structure, it is possible to reduce leaks between the oxide insulation layer 56 and the channel 52d. Further, it is possible to reduce the recombination current across the interface between the semiconductor and the oxide insulation layer.

Figure 16:
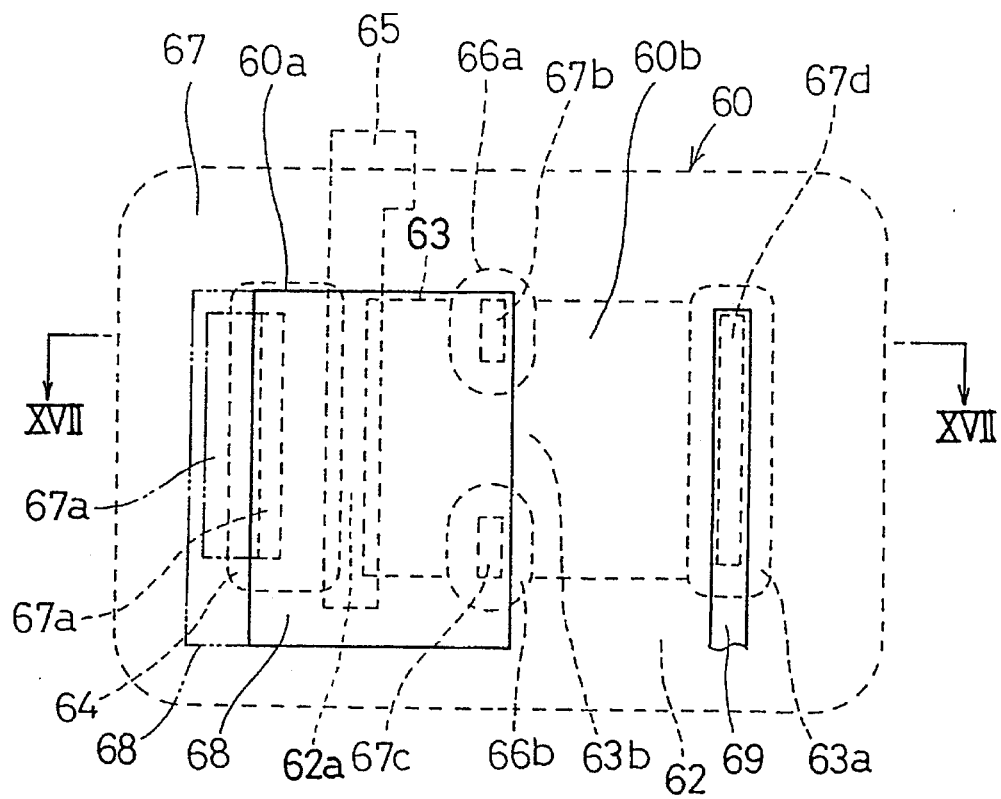
FIG. 16 is a plan view showing a field-effect semiconductor device according to a sixth embodiment of the invention.
Figure 17:
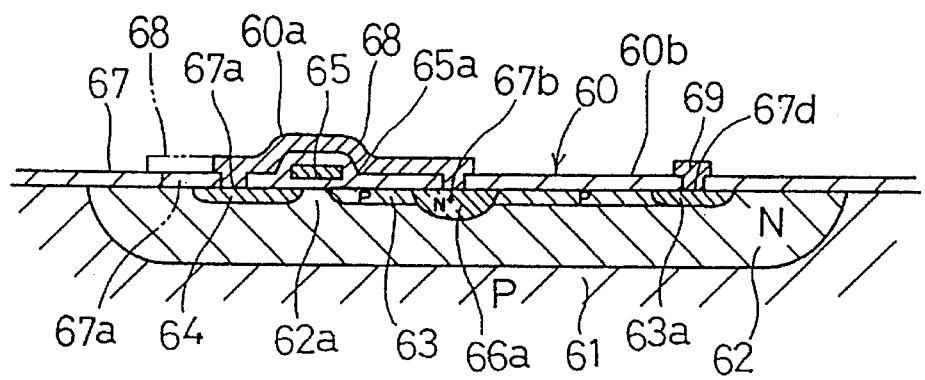
FIG. 17 is a cross-sectional view taken along line XVII—XVII in FIG. 16.

Referring to FIGS. 16 and 17, shown therein is a field-effect semiconductor device according to a sixth embodiment of the invention. As shown therein, a composite transistor 60 comprises a MOS field-effect transistor 60a and an SIT 60b. The composite transistor 60 comprises a p-type substrate 61 and an n-type island region (or well layer) 62 formed therein as a first one conductivity type semiconductor region. In the n-type island region 62, a p-type island region 63 as a first other conductivity type semiconductor region and a p⁺-type source region 64 as a second other conductivity type semiconductor region are formed. Further, a p⁺-type drain region 63a is formed to be contiguous to the right end of the p-type region 63.

A gate electrode 65 is provided to cover a channel 62a (i.e., a portion of the n-type region 62 between the p⁺-type source region 64 and the p-type region 63) via a gate oxide insulation layer 65a. A pair of n⁺-type gate regions 66a and 66b are provided as second one conductivity type regions such as to sandwich a channel 63b in the p-type region 63.

A source electrode 68 is provided such that it is in ohmic connection to the p⁺-type source region 64 and the n⁺-type gate regions 66a and 66b via contact holes 67a, 67b and 67c formed in an oxide insulation layer 67. A drain electrode 69 is provided such that it is in ohmic connection to the p⁺-type drain region 63a via a contact hole 67d formed in the oxide insulation layer 67.

With the above construction, the MOS field-effect transistor 60a comprises the p⁺-type source region 64, the p-type region (drain region) 63, the n-type channel 62a and the gate electrode 65. The SIT 60b, on the other hand, comprises the p-type region (source region) 63, the p⁺-type drain region 63a and the n⁺-type gate regions 66a and 66b.

Thus, the composite transistor 60 comprises the MOS field-effect transistor 60a and the SIT 60b in series with each other. The source region 64 of the MOS field-effect transistor 60a and the gate regions 66a and 66b of the SIT 60b are connected to one another by the source electrode 68.

In this case, when a voltage for turning on the MOS field-effect transistor 60a is applied to the gate electrode 65 thereof, the SIT 60b which is normally-on remains "on", and the composite transistor 60 is turned on, thus causing current to be passed between the source electrode 68 and the drain electrode 69.

On the other hand, when a voltage for turning off the MOS field-effect transistor 60a is applied to the gate electrode 65 thereof, the potential on the p-type region 63, which constitutes the drain region of the MOS field-effect transistor 60a and also constitutes the source region of the SIT 60b, becomes substantially equal to the potential on the drain electrode 69 to increase the state of reverse bias between the p-type region 63 and the n⁺-type gate regions 66a and 66b. Thus, the SIT 60b is also turned "off". As a result, the composite transistor 60 is turned off. At this time, the breakdown voltage of the composite transistor 60 is extremely increased.

It is possible, as shown by phantom lines in FIGS. 16 and 17, to broaden the contact hole 67a and provide an extension of the source electrode 68 so as to have the source electrode 68 to be in ohmic connection to the p⁺-type source region 64 and the n-type island region 62 via the contact hole 67a. With this arrangement, the gate regions 66a and 66b, the n-type island region 62 and the source region 64 can all be readily held at the same potential. The gate regions 66a and 66b and the n-type island region 62 are both n-type semiconductor regions and are contiguous to each other so that these regions are held at substantially the same potential. However, as described above, the extension of the source electrode 68 enables the regions 66a, 66b, 62 and 64 to be more stably held at the same potential.

Figure 18:
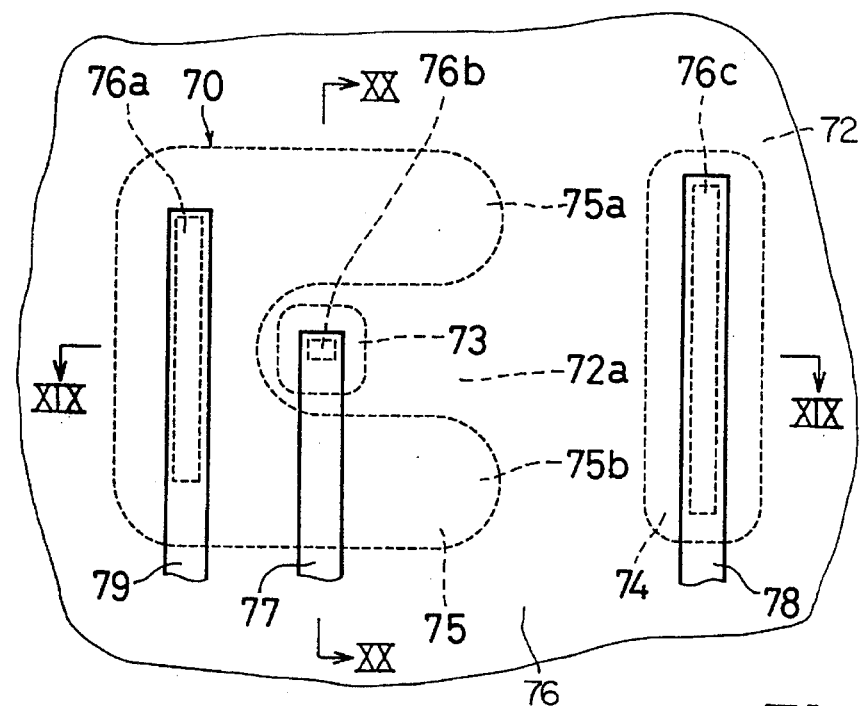
FIG. 18 is a plan view showing a field-effect semiconductor device according to a seventh embodiment of the invention.
Figure 19:
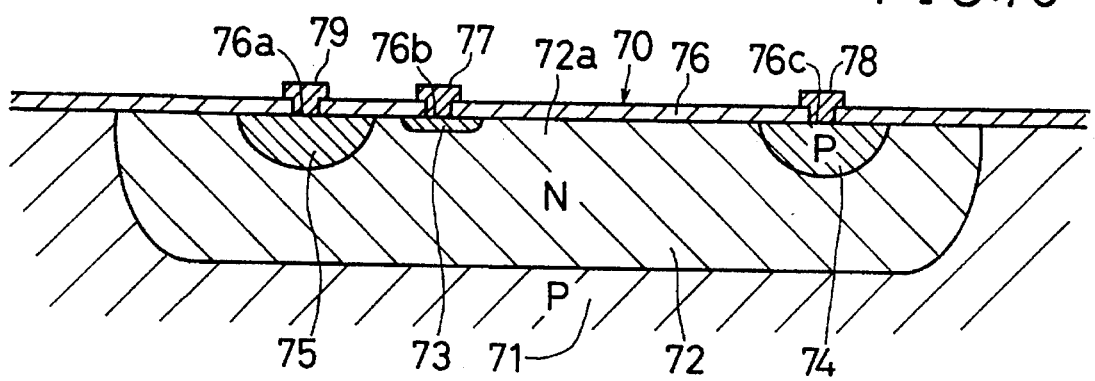
FIG. 19 is a cross-sectional view taken along line XIX—XIX in FIG. 18.
Figure 20:
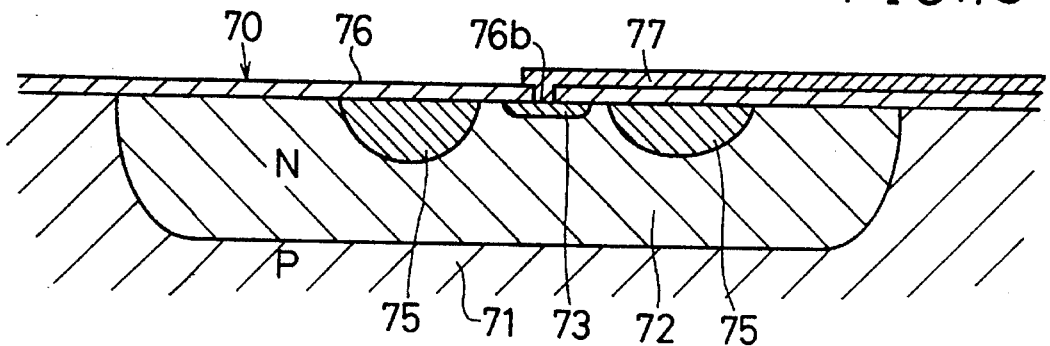
FIG. 20 is a cross-sectional view taken along line XX—XX in FIG. 18.

Referring to FIGS. 18 to 20, shown therein is a field-effect semiconductor device according to a seventh embodiment of the invention. As shown therein, and as in the previous first embodiment, a p-type substrate 71 includes an n-type island region 72 formed as a one conductivity type semiconductor region. In the n-type region 72, an n⁺-type source region 73 having higher n-type impurity concentration than the n-type region 72 and a p⁺-type drain region 74 are formed in the n-type region 72 such that they are contiguous to the surface of the n-type region 72. In this case, the source region 73 and the drain region 74 are of different conductivity types.

A channel-shaped p$^+$-type gate region 75 is provided as an other conductivity type semiconductor region having opposite end or arm portions 75a and 75b sandwiching a portion of the n-type region 72 coupling together the n$^+$-type source region 73 and the p$^+$-type drain region 74, i.e., a channel 72a.

A source electrode 77, a drain electrode 78 and a gate electrode 79 are provided such that they are in ohmic connection to the n$^+$-type source region 73, the p$^+$-type drain region 74 and the p$^+$-type gate region 75 via contact holes 76b, 76c and 76a formed in an oxide insulation layer 76, respectively.

With the above construction, the source region 73 and the drain region 74 are of opposite conductivity types, while the gate region 75 and the drain region 74 are of the same conductivity type. Thus, the structure constitutes a static induction thyristor (SI thyristor).

In this case, when the static induction thyristor is turned on, holes are injected not only from the gate region 75 but also from the drain region 74 into the n-type region 72. The conductivity of the n-type region 72 is thus increased. This means that for breakdown voltage improvement, the distance between the gate region 75 and the drain region 74 may be increased without increasing the on-state saturation voltage. It is thus possible to attain high breakdown voltage and low on-state saturation voltage. Further, by reducing the on-state saturation voltage the "on" time loss can be reduced.

In the embodiment shown in FIG. 4, the drain region 24 is of the n$^+$-type, and no hole is injected from the drain region 24 into the n-type region 22. Therefore, the on-state saturation voltage is increased by increasing the distance between the gate region 25 and the drain region 24.

Figure 21:
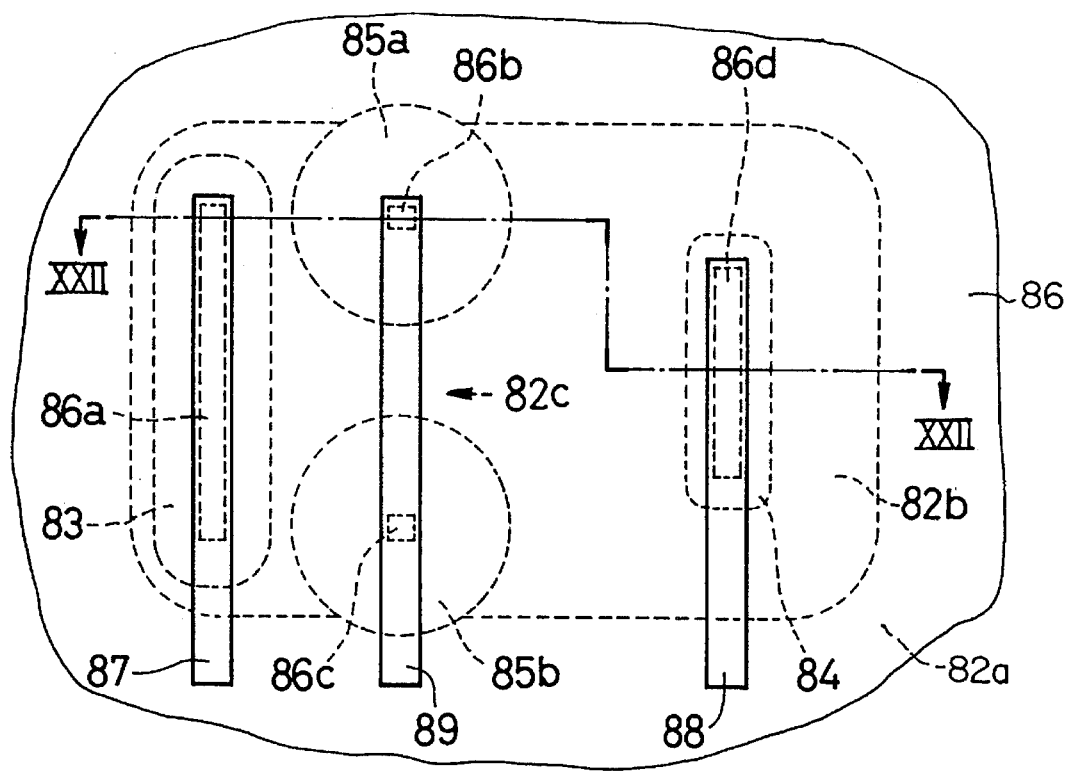
FIG. 21 is a plan view showing a field-effect semiconductor device according to an eighth embodiment of the invention.
Figure 22:
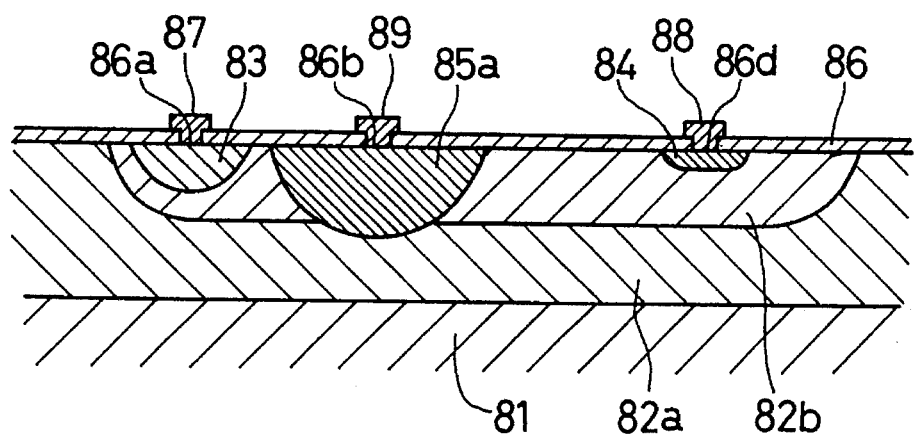
FIG. 22 is a cross-sectional view taken along line XXII—XXII in FIG. 21.

Referring to FIGS. 21 and 22, shown therein is a field-effect semiconductor device according to an eighth embodiment of the invention. As shown therein, a p-type substrate 81 includes an n-type island region (or well layer) 82a formed as a one conductivity type semiconductor region. In the n-type island region 82a, a p-type island region 82b is formed as an other conductivity type semiconductor region contiguous to the surface of the n-type region 82a. In the p-type region 82b, a p$^+$-type source region 83 having higher p-type impurity concentration than the p-type region 82b and an n$^+$-type drain region 84 are formed such that they are contiguous to the surface of the p-type region 82b. N$^+$-type gate regions 85a and 85b are provided as one conductivity type semiconductor regions such as to sandwich a portion of the p-type region 82b coupling together the p$^+$-type source region 83 and the n$^+$-type drain region 84, i.e., a channel 82c.

A source electrode 87, a drain electrode 88 and a gate electrode 89 are provided such that they are in ohmic connection to the p$^+$-type source region 83, the n$^+$-type drain region 84 and the n$^+$-type gate regions 85a and 85b via contact holes 86a, 86d and 86b and 86c in an oxide insulation layer 86, respectively.

With the above construction, substantially the same operation as the operation of the embodiment shown in FIGS. 10 to 12 can be obtained. However, the operation is of a thyristor and not of a transistor, as in the embodiment shown in FIGS. 10 to 12.

Further, by using the embodiment shown in FIGS. 21 and 22 in combination with the embodiment shown in FIGS. 18 to 20, it is possible to readily form a complementary circuit. Thus, it is possible to improve the circuit design freedom.

Figure 23:
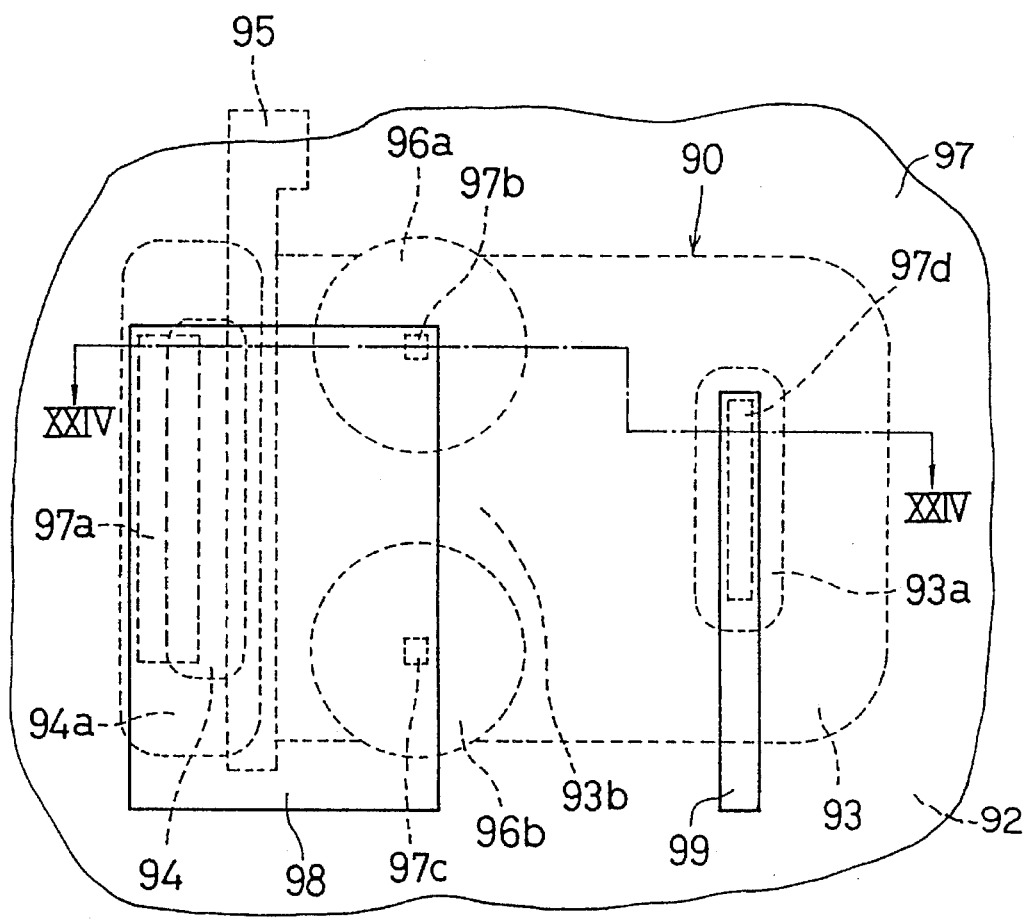
FIG. 23 is a plan view showing a field-effect semiconductor device according to a ninth embodiment of the invention.
Figure 24:
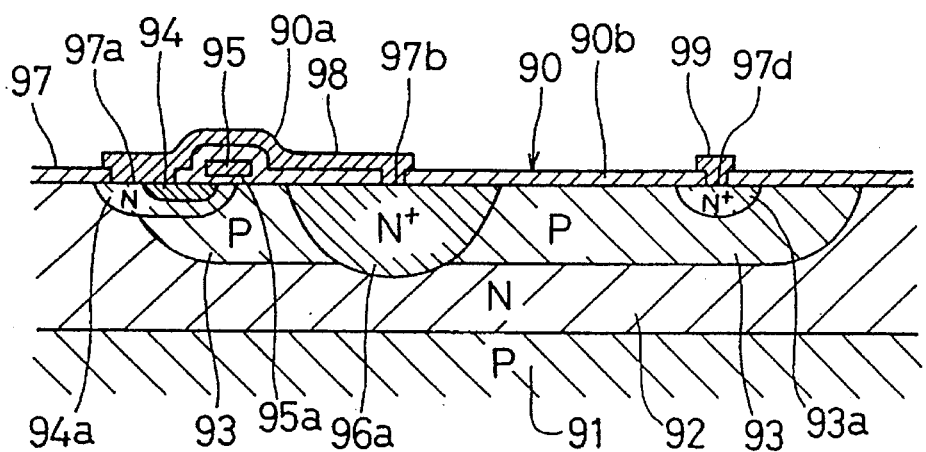
FIG. 24 is a cross-sectional view taken along line XXIV—XXIV in FIG. 23.

Referring to FIGS. 23 and 24, shown therein is a field-effect semiconductor device according to a ninth embodiment of the invention. As shown therein, a composite transistor 90 comprises a MOS field-effect transistor 90a and a static induction thyristor 90b. In this case, the composite transistor 90 constitutes an insulated gate bipolar transistor (IGBT). The composite transistor 90 comprises a p-type substrate 91 and an n-type island region (or well layer) 92 formed therein as a first one conductivity type semiconductor region. In the n-type island region 92 are formed a p-type island region 93 as a first other conductivity type semiconductor region and a p$^+$-type source region 94 as a second other conductivity type semiconductor region. Further, in the p-type region 93, an n$^+$-type drain region 93a is formed such that it is contiguous to the surface of the region 93.

A gate electrode 95 is formed such as to cover a channel 94a (i.e., a portion of the n-type layer 94a between the p$^+$-type source region 94 and the p-type region 93) via a gate oxide insulation layer 95a. In this case, a lateral double diffusion MOS (LDMOS) structure is obtained. A pair of n$^+$-type gate regions 96a and 96b are provided as second one conductivity type semiconductor regions such as to sandwich a channel 93b in the p-type region 93.

A source electrode 98 is in ohmic contact connection to the p$^+$-type source region 94 and the n-type region 94a via a contact hole 97a formed in an oxide insulation layer 97 and also to the n$^+$-type gate regions 96a and 96b via contact holes 97b and 97c formed in the oxide insulation layer 97.

A drain electrode 99 is in ohmic connection to the n$^+$-type drain region 93a via a contact hole 97d in the oxide insulation layer 97.

With the above construction, it is possible to reduce the thickness of the n-type region 94a constituting a channel in the MOS field-effect transistor 90a. It is thus possible to reduce the gate length (i.e., the length of the gate electrode 95). Thus, it is possible to reduce size of the MOS field-effect transistor 90a, thus permitting the size reduction of the composite transistor 90.

In addition, in the static induction thyristor 90b, like the embodiment shown in FIGS. 18 to 20, it is possible to improve the breakdown voltage and reduce the on-state saturation voltage. Further, with the reduction of the on-state saturation voltage it is possible to reduce the "on" time loss.

Further, since the source electrode 98 is ohmically connected to the p$^+$-type source region 94, the n-type region 94a and the n$^+$-type gate regions 96a and 96b, it is possible to hold the p$^+$-type source region 94, the n-type region 94a and the n$^+$-type gate regions 96a and 96b at the same potential. The n-type region 94a is contiguous to the n$^+$-type gate regions 96a and 96b via the n-type island region 92 which is the same n-type semiconductor region. Thus, the regions 94a, 96a and 96b may generally be held at the same potential, though the source electrode 98 is not connected to the n-type region 94a. However, as described above, the ohmic connection by the source electrode 98 enables the regions 94, 94a, 96a and 96b to be stably held at the same potential.

In the above individual embodiments, no buried layer is necessary. Thus, there is no need of using an expensive epitaxial wafer, but an inexpensive bulk wafer may be used, thus permitting cost reduction.

Further, in the above embodiments the gate regions (15, 25, 35, 45, 55, 66, 75, 85, 96a, 96b) may be made of a material which forms a Shottkey junction with other semiconductor regions. Further, in the semiconductor regions in the above embodiments, it is possible to replace the p-type regions with n-type ones and the n-type regions with p-type ones. Further, the transistors in the above embodiments may not be SITs and may be field-effect semiconductor devices including a field-effect transistor. Further, the MOS transistor shown in FIG. 17 may be replaced with a lateral double diffusion MOS (LDMOS).

As has been shown in detail, with the structure of the field-effect semiconductor device according to the invention, the portion coupling together the source region and the drain region, i.e., the channel, does not bypass the gate region. It is possible to reduce the channel length and hence reduce the on-state source-drain saturation voltage.

In addition, it is possible to select the conductivity type of the drain region to let the field-effect semiconductor device according to the invention constitute a transistor or a thyristor. Further, with the structure according to the invention, it is possible to increase the breakdown voltage of the SIT in the depth direction. Further, with the structure according to the invention, it is possible to realize a complementary circuit construction and thus increase the circuit design freedom. Further, with the structure according to the invention, it is possible to prevent element surface leaks of current flowing through the channel. Further, with the structure according to the invention, it is possible to extremely improve the breakdown voltage of the MOS field-effect transistor. Further, with the structure according to the invention, it is possible to reduce the size of the MOS field-effect transistor constituting a composite transistor, thus permitting size reduction thereof. Thus, by using the composite transistor for an integrated circuit, it is possible to improve the integration density of the integrated circuit and reduce the cost thereof.

Figure 25:
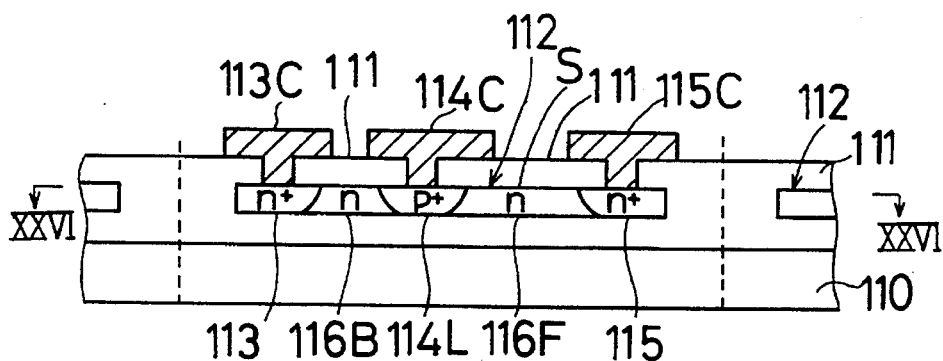
FIG. 25 is a cross-sectional view showing a field-effect semiconductor device according to a tenth embodiment of the invention.
Figure 27:
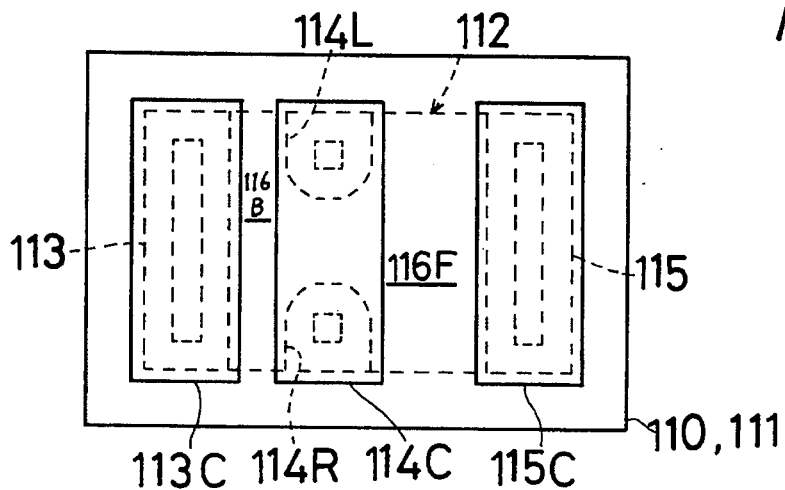
FIG. 27 is a plan view showing the field-effect semiconductor device according to the tenth embodiment of the invention.

Referring to FIGS. 25 and 27, shown therein is a field-effect semiconductor device according to a tenth embodiment of the invention. As shown therein, the semiconductor device of the tenth embodiment includes a support substrate 110 and an oxide insulation layer 111. The support substrate 110 is made of Si or glass but may be made of metal. The insulation layer 111 is made of $SiO_2$. The support substrate 110 and the insulation layer 111 forms an insulating support substrate.

In the insulation layer 111 is formed a semiconductor layer 112 in the form of a thin film and of one conductivity type (in this case n-type). As shown in FIG. 25, in manufacture, a plurality of semiconductor layers 112 are formed in the insulating film 111 such that each has an area corresponding to each semiconductor device.

Figure 26:
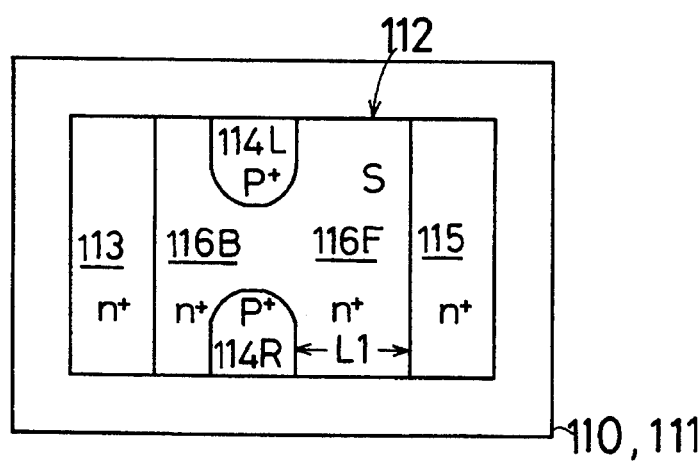
FIG. 26 is a cross-sectional view taken along line XXVI—XXVI in FIG. 25.

In an intermediate portion of the principal surface S of the semiconductor layer 112, a plurality of gate regions (in this case two gate regions 114L and 114R) of other conductivity type (in this case p-type) are formed. In this embodiment, the gate regions 114L and 114R are formed in an intermediate portion between the left and right ends as shown in FIGS. 26 and 27. The gate regions 114L and 114R are formed at an upper position and a lower position, respectively, in FIGS, 26 and 27. It is-possible to form three or more gate region divisions or form a single concentrated gate region.

In the principal surface S of the semiconductor layer 112, an $n^+$-type source region 113 and an $n^+$-type drain region 115 which are doped with an n-type impurity at a high concentration, are formed at positions on the opposite sides of the gate regions 114L and 114R. In the semiconductor layer 112, a region between the gate regions 114L and 114R constitute a channel region.

The insulation layer 111 has windows formed at positions corresponding to the source region 113, the gate regions 114L and 114R and the drain region 115. Through these windows, a source electrode 113C, a gate electrode 114C and a drain electrode 115c are connected to the source region 113, the gate regions 114L and 114R and the drain region 115, respectively.

The semiconductor device of the tenth embodiment is a static induction transistor, and it is possible to realize either normally-on type or normally-off type. In the case of the normally-on type, the source-drain resistance is low in the absence of potential applied to the gate electrode 114c. As a negatively increasing potential is applied to the gate electrode 114c, a depletion layer is spread in the channel region between the gate regions 114L and 114R, thus increasing the source-drain resistance. For instance, when −5 V is applied to the gate electrode 114c, it is possible to realize a characteristic that no source-drain current flows with a drain voltage lower than 30 V.

In this embodiment, it is possible to adjust the breakdown voltage by adjusting the distance L1 between the gate regions 114L and 114R and the drain region 115 and also the impurity concentration in the semiconductor layer 112. Depending on the characteristic which is desired to be realized in the static induction transistor, the impurity concentration may not be freely selected. Even in such a case, it is possible to obtain the necessary breakdown voltage through adjustment of the distance L1 noted above.

Figure 28:
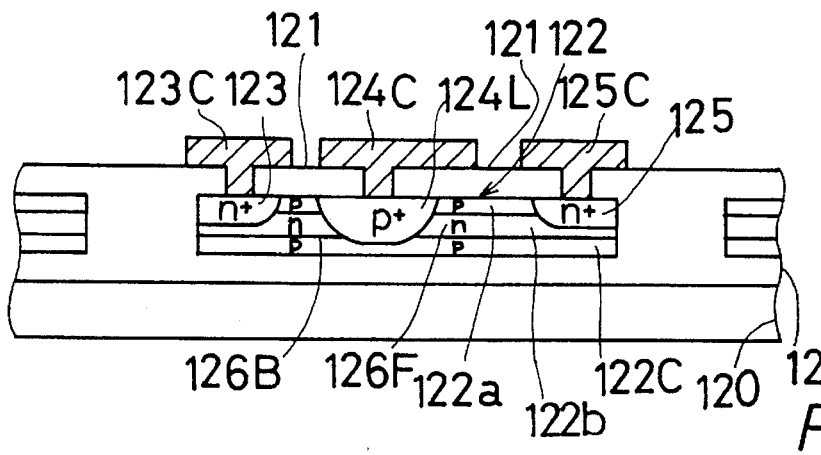
FIG. 28 is a cross-sectional view showing a field-effect semiconductor device according to an 11th embodiment of the invention.

Referring to FIG. 28, shown therein is a field-effect semiconductor device according to an 11th embodiment of the invention. As shown therein, a one conductivity type semiconductor layer 122b is formed in the form of a thin film in an oxide insulation layer 121 such that it is sandwiched between other conductivity type semiconductor layers 122a and 122c. For the rest, this embodiment is the same as the tenth embodiment, and like parts are designated by reference numerals with the same last digit.

The one conductivity type semiconductor layer 122b sandwiched between the other conductivity type semiconductor layers 122a and 122c, has an effect of reducing the source-drain leak current across the interface between the semiconductor layer and the insulating material.

Figure 29:
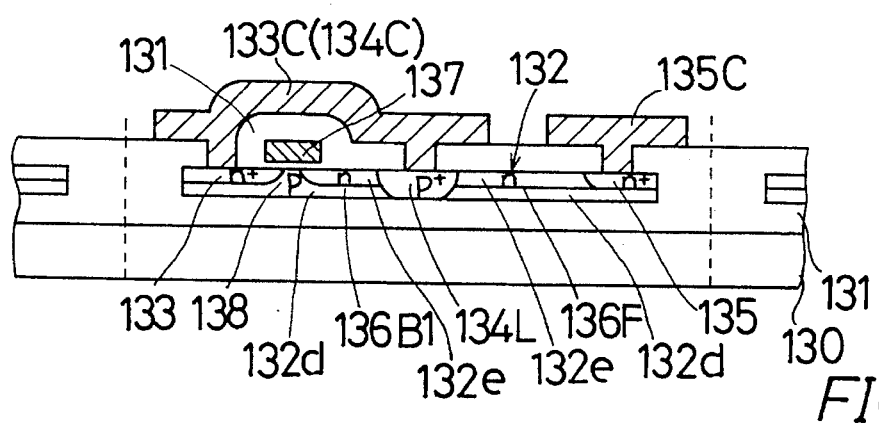
FIG. 29 is a sectional view showing a field-effect semiconductor device according to a 12th embodiment of the invention.
Figure 30:
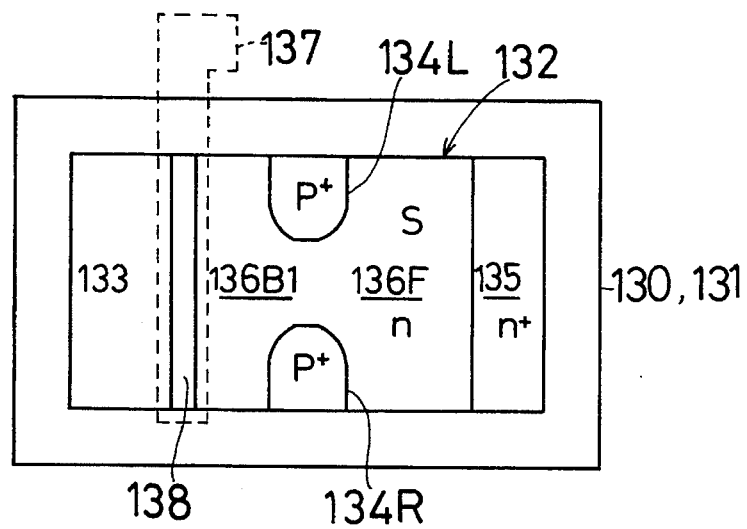
FIG. 30 is a plan view showing the field-effect semiconductor device according to the 12th embodiment of the invention.
Figure 31:
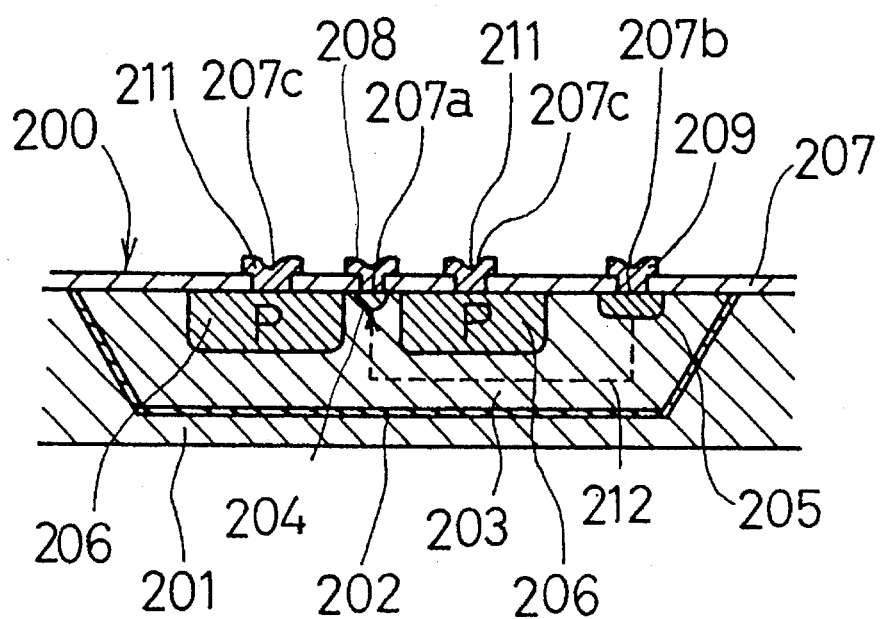
FIG. 31 is a sectional view showing a prior art example.
Figure 32:
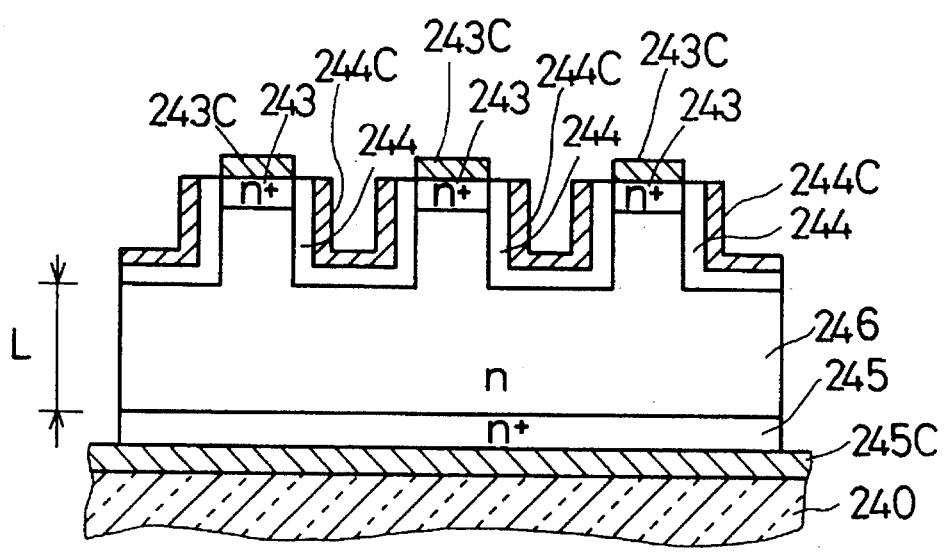
FIG. 32 is a sectional view showing a different prior art example.

Referring to FIGS. 29 and 30, shown therein is a field-effect semiconductor device according to a 12th embodiment of the invention. As shown therein, a structure comprising a MOS transistor and a static induction transistor in series with each other is realized as a thin film semiconductor device. Parts like those in the 10th and the 11th embodiments are designated by like reference numerals and symbols, and their description will not be repeated.

As shown in FIG. 29, an other conductivity type channel region 138 for a MOS transistor is formed in an intermediate portion of the principal surface S of a one conductivity type semiconductor layer 132 between gate regions 134L and 134R and a source region 133.

To this end, as shown in FIG. 29, a p-type semiconductor film 132d is formed in advance in an oxide insulation layer 131. Then, at least an upper half of the film 132d excluding the channel region 138 of the MOS transistor is converted to an n-type semiconductor film 132e. Subsequently, as in the 10th and the 11th embodiments, an $n^+$-type source region 133, $p^+$-type gate regions 134L and 134R and an $n^+$-type drain region 135 are formed. Further, a gate electrode 137 for the MOS transistor is formed in the insulation layer 131 such that it faces the channel region 138 for the MOS transistor. An electrode 133c which is connected to the source region 133 and an electrode 134c which is connected to the gate regions 134L and 134R are connected to each other, and the source region 133 and the gate regions 134L and 134R are held at the same potential at all times.

With this construction, the one conductivity type semiconductor layer 13681 between the gate regions 134L and 134R and the MOS transistor channel region 138 constitutes the drain region of the MOS transistor, and the MOS transistor is constituted by the source region 133, the channel region 138 and the n-type drain region 136B1. The drain region 136B1 of the MOS transistor also serves as the source region of the static induction transistor, and the static induction transistor is constituted by the source region 136B1, the gate regions 134L and 134R, and the drain region 135.

The electrode 133c (or 134c) holds the source region 133 of the MOS transistor and the gate regions 134L and 134R of the static induction transistor at the same potential. The static induction transistor is formed to be of the normally-on type.

When a potential for turning on the MOS transistor is applied to the gate electrode 137 of the MOS transistor, the MOS transistor is turned on. At this time, no voltage is applied between the source region 133 and the gate regions 134L and 134R of the static induction transistor. Since the static induction transistor has the normally-on characteristic, the whole system is turned on. That is, with the application of the "on" voltage to the gate electrode 137 of the MOS transistor, a current is caused to flow between the electrodes 133c and 135c.

When the voltage on the gate electrode 137 of the MOS transistor becomes a voltage to turn off the MOS transistor, a positive potential is produced on the region 136B1, which serves both as the drain region of the MOS transistor and the source region of the static induction transistor, and the reverse bias state is produced between the source region 133 and the gate regions 134L and 134R of the static induction transistor. Thus, the static induction transistor is also turned off. The positive potential on the drain region 135 of the composite MOS transistor is below the breakdown voltage of the MOS transistor, and it spreads the depletion layer from the gate regions 134L and 134R of the static induction transistor, thus turning off the static induction transistor. As a result, the breakdown voltage of the whole element is extremely increased. In the above embodiments, the breakdown voltage can be further increased by replacing the gate region (114, 124, 134L, 134R) with a material which forms a Shottkey junction with semiconductor of other regions.

While the above embodiments have been described in the cases when the one conductivity type is n-type, the one conductivity type may of course be p-type as well. Further, the MOS transistor shown in FIG. 29 may be replaced with a lateral double diffusion MOS (LDMOS). Further, the static diffusion transistor may be replaced with a junction field-effect transistor.

According to the invention, it is possible to guarantee a high breakdown voltage of the transistor which is formed with a semiconductor layer in the form of a thin film, and it is thus possible to enjoy the merits of the thin film transistor in the case requiring high breakdown voltage as well.

While the invention has been described with reference to preferred embodiments thereof, it is to be understood that modifications or variations may be easily made without departing from the scope of the present invention which is defined by the appended claims.

What is claimed is:

1. A field-effect semiconductor device comprising:
   a semiconductor region of a first conductivity type having a surface;
   a source region of a second conductivity type disposed in a first portion of said semiconductor region such that said source region is contiguous to said surface of said semiconductor region;
   a drain region disposed in a second portion of said semiconductor region such that said drain region is contiguous to said surface of said semiconductor region and such that a portion of said semiconductor region at said surface thereof linearly couples said source region to said drain region; and
   gate regions of a third conductivity type disposed in said semiconductor region and contiguous to said surface of said semiconductor region, wherein said portion of said semiconductor region linearly coupling said source region and said drain region to each other is disposed between said gate regions.

2. The field-effect semiconductor device according to claim 1, wherein said drain region is of said second one conductivity type so that said field-effect semiconductor device constitutes a static induction transistor.

3. The field-effect semiconductor device according to claim 1, wherein said drain region is of a fourth conductivity type so that said field-effect semiconductor device constitutes a static induction thyristor.

4. The field-effect semiconductor device according to claim 1, further comprising an other a first semiconductor region between said source region and said semiconductor region.

5. The field-effect semiconductor device according to claim 1, further comprising an other a first layer provided proximate to a surface portion of said portion of said semiconductor region linearly coupling said source region and said drain region to each other.

6. The field-effect semiconductor device according to claim 1, wherein said semiconductor region, said source region, said drain region and said gate regions are formed in a single thin film.

7. The field-effect semiconductor device according to claim 6, wherein said thin film is formed in an insulator such that said thin film is sandwiched between two thin films of said other conductivity type.

8. A field-effect semiconductor device comprising:
   a first semiconductor region of a first conductivity type having a surface defined in a first plane;
   a second semiconductor region of a second conductivity type disposed in said first semiconductor region and contiguous to said surface of said first semiconductor region, said second semiconductor region having a surface defined in a second plane that corresponds to said first plane;
   a source region of a third conductivity type disposed in a first portion of said second semiconductor region and contiguous to a surface of said second semiconductor region;
   a drain region disposed in a second portion of said second semiconductor region, wherein said source region and said drain region are linearly coupled to one another via a portion of said second semiconductor region disposed along said surface thereof; and
   gate regions of a fourth conductivity type disposed in a third portion of said first semiconductor region and contiguous to said surface of said second semiconductor region, wherein said portion of said second semiconductor region linearly coupling said source region and said drain region to each other is disposed between gate regions.

9. The field-effect semiconductor device according to claim 8, wherein said drain region is of said third conductivity type so that said field-effect semiconductor device constitutes a static induction transistor.

10. The field-effect semiconductor device according to claim 8, wherein said drain region is of a fifth conductivity type so that said field-effect semiconductor device constitutes a static induction thyristor.

11. The field-effect semiconductor device according to claim 8, further comprising a first layer of a fifth conductivity type proximate to said a surface portion of said second semiconductor region linearly coupling said source region and said drain region to each other.

12. The field-effect semiconductor device according to claim 8, wherein said first semiconductor region, said second semiconductor region, said source region, said drain region and said gate regions are formed in a single thin film.

13. The field-effect semiconductor device according to claim 12, wherein said thin film is formed in an insulator such that said thin film is sandwiched between two thin films.

14. A field-effect semiconductor device comprising:
  a first semiconductor region of a first conductivity type having a surface defined in a first plane;
  a second semiconductor region of a second conductivity type disposed in said first semiconductor region and contiguous to said surface of said first semiconductor region said second semiconductor region having a surface defined in a second plane corresponding to said first plane;
  a drain region disposed in said first semiconductor region and contiguous to said second semiconductor region and to said surface of said first semiconductor region;
  third semiconductor regions of a third conductivity type disposed so as to be contiguous to peripheral portions of said second semiconductor region and such that a portion of said second semiconductor region at said surface thereof is disposed between said third semiconductor regions;
  a fourth semiconductor region of a fourth conductivity type disposed in said first semiconductor region and contiguous to said surface of said first semiconductor region such that said fourth semiconductor region is spaced apart a predetermined distance from said second conductivity type semiconductor region, said fourth semiconductor region being linearly coupled to said drain region via a portion of said second semiconductor region at said surface thereof disposed between said third semiconductor regions;
  a gate electrode disposed over a portion of said first semiconductor region between said second semiconductor region and said fourth semiconductor region; and
  a conductive material electrically connecting said third semiconductor regions and said fourth semiconductor region to each other.

15. The field-effect semiconductor device according to claim 14, wherein said drain region is of said fourth conductivity type so that said second semiconductor region, said third semiconductor regions and said drain region constitute a static induction transistor.

16. The field-effect semiconductor device according to claim 14, wherein said drain region is of a fifth conductivity type so that said second semiconductor region, said third semiconductor regions and said drain region constitute a static induction thyristor.

17. A field-effect semiconductor device according to claim 14, wherein said fourth semiconductor region, said second semiconductor region, said first semiconductor region between said fourth and said second semiconductor regions, and said gate electrode constitute a MOS field-effect transistor.

18. The field-effect semiconductor device according to claim 17, wherein said drain region is of a fifth conductivity type so that said field-effect semiconductor device constitutes an insulated gate bipolar transistor comprising a MOS field-effect transistor and a static induction thyristor in series therewith.

19. The field-effect semiconductor device according to claim 14, wherein said first semiconductor region, said second semiconductor region, said third semiconductor regions, and said fourth semiconductor region are formed in a single thin film.

20. A field-effect semiconductor device comprising:
  a first semiconductor region of a first conductivity type and having a surface defined in a first plane;
  a second semiconductor region of a second conductivity type disposed in said first semiconductor region and contiguous to said surface of said first semiconductor region said second semiconductor region having a surface defined in a second plane that corresponds to said first plane;
  a drain region disposed in said second semiconductor region and contiguous to said first plane;
  third semiconductor regions of a third conductivity type disposed such that a portion of said second semiconductor region at said surface thereof is between said third semiconductor regions;
  a fourth semiconductor region disposed at a side of second semiconductor region opposite said drain region and contiguous to said second semiconductor region, said fourth semiconductor region being linearly coupled to said drain region via said portion of said second semiconductor region at said surface thereof disposed between said third semiconductor regions;
  a fifth semiconductor region of a fifth conductivity type disposed in said fourth semiconductor region and contiguous to said first plane such that a portion said fourth semiconductor region is disposed between said second semiconductor region and said fifth semiconductor region;
  a gate electrode covering a portion of said fourth semiconductor region located between said second semiconductor region and said fifth semiconductor region; and
  a conductive material electrically connecting said fifth semiconductor region and said third semiconductor region to each other.

21. The field-effect semiconductor device according to claim 20, wherein said drain region is of a sixth conductivity type such that said second semiconductor region, said third semiconductor regions and said drain region constitute a static induction transistor.

22. The field-effect semiconductor device according to claim 20, wherein said drain region is of a seventh conductivity type such that said second semiconductor region, said third semiconductor regions and said drain region constitute a static induction thyristor.

23. The field-effect semiconductor device according to claim 20, wherein said fifth semiconductor region, said second semiconductor region, semiconductor region between said fifth and said second semiconductor regions, and said gate electrode constitute a MOS field-effect transistor.

24. The field-effect semiconductor device according to claim 23, wherein said drain region is of a conductivity type such that said field-effect semiconductor device constitutes an insulated gate bipolar transistor comprising a MOS field-effect transistor and a static induction thyristor in series therewith.

25. The field-effect semiconductor device according to claim 20, wherein said first semiconductor region, said second semiconductor region, said third semiconductor regions, and said fifth semiconductor region are formed in a single thin film.

* * * * *